US007018954B2

(12) United States Patent
Thieme et al.

(10) Patent No.: US 7,018,954 B2
(45) Date of Patent: Mar. 28, 2006

(54) PROCESSING OF MAGNESIUM-BORIDE SUPERCONDUCTORS

(75) Inventors: Cornelis L. Thieme, Westborough, MA (US); Martin W. Rupich, Framingham, MA (US); Alexander Otto, Chelmsford, MA (US); Gilbert N. Riley, Jr., Marlboro, MA (US)

(73) Assignee: American Superconductor Corporation, Westborough, MA (US)

( * ) Notice: Subject to any disclaimer, the term of this patent is extended or adjusted under 35 U.S.C. 154(b) by 79 days.

(21) Appl. No.: 10/094,076

(22) Filed: Mar. 8, 2002

(65) Prior Publication Data

US 2002/0173428 A1 Nov. 21, 2002

Related U.S. Application Data

(60) Provisional application No. 60/303,058, filed on Jul. 5, 2001, provisional application No. 60/274,752, filed on Mar. 10, 2001, provisional application No. 60/274,402, filed on Mar. 9, 2001.

(51) Int. Cl.
*H01B 12/00* (2006.01)
*C04B 35/58* (2006.01)

(52) U.S. Cl. ...................... 505/430; 505/433; 505/490; 29/599

(58) Field of Classification Search ................ 505/430, 505/433, 490; 29/599
See application file for complete search history.

(56) References Cited

U.S. PATENT DOCUMENTS

| | | | |
|---|---|---|---|
| 4,785,142 | A | 11/1988 | Smith, Jr. et al. |
| 4,962,084 | A | 10/1990 | deBarbadillo, II et al. |
| 5,034,373 | A | 7/1991 | Smith et al. |
| 5,470,530 | A | 11/1995 | Cava et al. |
| 5,501,746 | A | 3/1996 | Egawa et al. |
| 2002/0111275 | A1 | 8/2002 | Finnemore et al. |
| 2002/0127437 | A1 | 9/2002 | Cheong et al. |
| 2002/0132739 | A1 | 9/2002 | Kang et al. |
| 2002/0198111 | A1 | 12/2002 | Tomsic |
| 2005/0163644 | A1 | 7/2005 | Thieme et al. |

FOREIGN PATENT DOCUMENTS

| | | | |
|---|---|---|---|
| EP | 0 449 890 B1 | | 2/1996 |
| JP | 2002-222619 | | 9/2002 |
| JP | 2004217463 | * | 8/2003 |
| WO | WO 02/35614 A2 | | 5/2002 |
| WO | WO 02/055435 A1 | | 7/2002 |
| WO | WO 02/064859 A2 | | 8/2002 |
| WO | WO 02/069353 A1 | | 9/2002 |
| WO | WO 02/071499 A1 | | 9/2002 |

(Continued)

OTHER PUBLICATIONS

Kobayashi et al "Synthesis of Mg-B-C by Mechanical Alloying . . . ", Journal of the Japan Society of Powder and Powder Metallurgy, 45:965-968, 1998 (English translation).*

(Continued)

*Primary Examiner*—Mark Kopec
(74) *Attorney, Agent, or Firm*—Wilmer Cutler Pickering Hale and Dorr LLP

(57) ABSTRACT

Processes for the fabrication of $MgB_2$ powder and wires are provided. Powders are produced by mechanically alloying magnesium- and boron-containing precursors under controlled conditions to avoid secondary phase and impurity formation. Powders are also prepared by vapor phase reaction of volatile magnesium- and boron-containing precursors. Wires, tapes, films and coatings are provided.

25 Claims, 6 Drawing Sheets

FOREIGN PATENT DOCUMENTS

WO WO 02/072501 A2 9/2002

OTHER PUBLICATIONS

Ahn et al. "Carbon substitution effect in MgB2." Papers on cond-mat archive: Mar. 2001 [online], [retrieved on Jul. 19, 2002]. Retrieved from the Internet <URL: http://xxx-.yukawa.kyoto-u.ac.jp/abs/cond-mat/0103169>.

Gorshunov et al. "Optical measurements of the superconducting gap in MgB2." Papers on cond-mat archive: Mar. 2001 [online], [retrieved on Jul. 19, 2002]. Retrieved from the Internet <URL: http://xxx.yukawa.kyoto-u.ac.jp/abs/cond-mat/0103164>.

Medvedeva et al. "Electronic structure of superconducting MgB2 and related . . . " Papers on cond-mat archive: Mar. 2001 [online], [retrieved on Jul. 19, 2002]. Retrieved from the Internet <URL: http://xxx.yukawa.kyoto-u.ac.jp/abs/cond-mat/0103157>.

Voelker et al. "Acoustic Plasmons in MgB2." Papers on cond-mat archive: Mar. 2001 [online], [retrieved on Jul. 19, 2002]. Retrieved from the Internet <URL: http://xxx.yukawa.kyoto-u.ac.jp/abs/cond-mat/0103082>.

Suo et al. "Large transport critical currents in dense Fe- and Ni-clad MgB2 . . . " Papers on cond-mat archive: Jun. 2001 [online], [retrieved on Jul. 22, 2002]. Retrieved from the Internet <URL: http://arxiv.org/ftp/cond-mat/papers/0106/0106341.pdf>.

Wang et al. "Very fast formation of superconducting MgB2/Fe wires with high Jc." Papers on cond-mat archive: Jun. 2001 [online], [retrieved on Jul. 22, 2002]. Retrieved from the Internet <URL: http://arxiv.org/ftp/cond-mat/papers/0106/0106148.pdf>.

Zhai et al. "Growth mechanism of superconducting MgB2 films . . . " Papers on cond-mat archive: Apr. 2001 [online], [retrieved on Jul. 22, 2002]. Retrieved from the Internet <URL: http://arxiv.org/ftp/cond-mat/papers/0103/0103618.pdf>.

Zhao et al. "Influence of the starting composition on the structural . . . " Papers on cond-mat archive: May 2001 [online], [retrieved on Jul. 22, 2002]. Retrieved from the Internet <URL: http://arxiv.org/ftp/cond-mat/papers/0105/0105053.pdf>.

Blank et al. "Superconducting Mg-B films by pulsed laser deposition in an in-situ . . . " Papers on cond-mat archive: Mar. 2001 [online], [retrieved on Jul. 22, 2002]. Retrieved from the Internet <URL: http://arxiv.org/ftp/cond-mat/papers/0103/0103543.pdf>.

Brinkman et al. "Superconducting thin films of MgB2 on (001)-Si by pulsed . . . " Papers on cond-mat archive: Mar. 2001 [online], [retrieved on Jul. 22, 2002]. Retrieved from the Internet <URL: http://arxiv.org/ftp/cond-mat/papers/0103/0103198.pdf>.

Canfield et al. "Superconductivity in Dense MgB2 Wires." Papers on cond-mat archive: Feb. 2001 [online], [retrieved on Jul. 22, 2002]. Retrieved from the Internet <URL: http://arxiv.org/PS_cache/cond-mat/pdf/0102/0102289.pdf>.

Che et al. "Preparation and Superconductivity of a MgB2 Superconducting Tape." Papers on cond-mat archive: May 2001 [online], [retrieved on Jul. 22, 2002]. Retrieved from the Internet <URL: http://arxiv.org/PS_cache/cond-mat/pdf/0105/0105215.pdf>.

Glowacki et al. "Superconducting Properties of the powder-in-tube Cu-Mg-B . . . " Papers on cond-mat archive: Sep. 2001 [online], [retrieved on Jul. 22, 2002]. Retrieved from the Internet <URL: http://arxiv.org/ftp/cond-mat/papers/0109/0109085.pdf>.

Grasso et al. "Large transport critical currents in unsintered MgB2 superconducting tapes." Papers on cond-mat archive: Mar. 2001 [online], [retrieved on Jul. 22, 2002]. Retrieved from the Internet <URL: http://arxiv.org/ftp/cond-mat/papers/0103/0103563.pdf>.

Handstein et al. "Fully dense MgB2 superconductor textured by hot deformation." Papers on cond-mat archive: Jun. 2001 [online], [retrieved on Jul. 22, 2002]. Retrieved from the Internet <URL: http://arxiv.org/ftp/cond-mat/papers/0103/0103408.pdf>.

Jung et al. "Effect of sintering temperature under high pressure . . . " Papers on cond-mat archive: Feb. 2001 [online], [retrieved on Jul. 22, 2002]. Retrieved from the Internet <URL: http://arxiv.org/PS_cache/cond-mat/pdf/0102/0102383.pdf>.

Kolesnikov et al. "Synthesis of MgB2 from elements." Papers on cond-mat archive: Jul. 2001 [online], [retrieved on Jul. 22, 2002]. Retrieved from the Internet <URL: http://arxiv.org/PS_cache/cond-mat/pdf/0107/0107164.pdf>.

Komori et al. "A new approach for the fabrication of MgB2 . . . " Papers on cond-mat archive: Mar. 2002 [online], [retrieved on Jul. 22, 2002]. Retrieved from the Internet <URL: http://arxiv.org/ftp/cond-mat/papers/0203/0203113.pdf>.

Larbalestier et al. "Strongly linked current flow in polycrystalline forms . . . " Papers on cond-mat archive: Feb. 2001 [online], [retrieved on Jul. 22, 2002]. Retrieved from the Internet <URL: http://arxiv.org/ftp/cond-mat/papers/0102/0102216.pdf>.

Liu et al. "Preparation of 18-filament Cu/NbZr/MgB2 tape . . . " Papers on cond-mat archive: Jun. 2001 [online], [retrieved on Jul. 22, 2002]. Retrieved from the Internet <URL: http://arxiv.org/ftp/cond-mat/papers/0106/0106061.pdf>.

Martinez et al. "Study of Ag and Cu/MgB2 powder-in-tube composite . . . " Papers on cond-mat archive: Mar. 2002 [online], [retrieved on Jul. 22, 2002]. Retrieved from the Internet <URL: http://arxiv.org/ftp/cond-mat/papers/0203/0203464.pdf>.

Nast et al. "Mechanically reinforced MgB2 wires and tapes with high transport . . . " Papers on cond-mat archive: Aug. 2001 [online], [retrieved on Jul. 22, 2002]. Retrieved from the Internet <URL: http://arxiv.org/ftp/cond-mat/papers/0108/0108458.pdf>.

Plecenik et al. "MgB2 superconductor thin films on Si and Al2O3 substrates." Papers on cond-mat archive: Jun. 2001 [online], [retrieved on Jul. 22, 2002]. Retrieved from the Internet <URL: http://arxiv.org/ftp/cond-mat/papers/0105/0105612.pdf>.

Song et al. "Single-filament composite MgB2/SUS ribbons by powder-in-tube . . . " Papers on cond-mat archive: Jun. 2001 [online], [retrieved on Jul. 22, 2002]. Retrieved from the Internet <URL: http://arxiv.org/ftp/cond-mat/papers/0106/0106124.pdf>.

Nagamatsu, J. et al., "Superconductivity at 39K in Magnesium Diboride", Nature, vol. 410, No. 6824, Mar. 1, 2001, pp. 63-64.

Kobayash, K. et al., "Synthesis of Mg-B-C by Mechancial Alloying and Their Consolidation", Journal of the Japan Society of Powder and Powder Metallurgy, vol. 45, No. 10, Oct. 1998, pp. 965-968.

Sumption, M.D., et al, "Transport Current in MgB2 based Superconducting Strand at 4, 2 K and Self-Field", ARXIV. ORG E-Print Archive [On-line], Feb. 23, 2001, Retrieved from teh Internet: <URL:http://www.arxiv.org/pdf/cond-mat/010 2441> [retrieved on Jan. 22, 2003].

Cunningham, C.E., et al., "Synthesis and Processing of MgB2 Powders and Wires", Physcia C., vol. 353, No. 1-2, May 1, 2001, pp. 5-10.

Glowacki, B.A., et al., "Superconductivity of Power-in-Tube MgB2 Wires", Superconductor Science & Technology, vol. 14, No. 4, Apr. 2001, pp. 193-199.

Goldacker, W., et al., "High Transport Current in Mechanically Reinforced MgB2 Wires", 10th International Workshop on Critical Currents in Superconductors, Gottingen, Germany, Jun. 4-7, 2001, vol. 14, No. 9, pp. 787-793.

Jin, S. et al., High-Critical Currents in Iron-Clad Superconducting MgB2 Wires, Nature, vol. 411, No. 6837, May 31, 2001, pp. 563-565.

Agrestinia et al., "High $T_c$ Superconductivity in a Critical Range of Micro-Strain and Charge Density in Diborides," 2001, pp. 1-14.

Bud'ko et al., "Boron Isotope Effect in Superconducting $MgB_2$," Ames Lab and Dept. of Physics and Astronomy2003, Iowa St. Univ., Ames, IA, pp. 1-4.

Eom et al., "Thin Film Magnesium Boride Superconductor with Very High Critical Current Density and Enhanced Irreversibility Field," Nature, 2001, pp. 1-4.

Larson et al., "Mechanically Alloyed Superconducting Compounds," Manufacturing of Superconductor Materials, pp. 155-163, Engine Components Div. of Eaton Corp., Battle Creek, MI.

Nagamatsu et al., "Superconductivity at 39K in Magnesium Diboride," Nature, 2001, vol. 410, pp. 63-64.

Otto et al., "Multifilamentary Bi-2223 Composite Tapes Made by a Metallic Precursor Route," Presentation at Applied Superconductivity Conference, Aug. 1992, Chicago, IL.

Yurek et al., "Synthesis of a Superconducting Oxide by Oxidation of a Metallic Precursor," Metallurgical Transactions A, 1987, vol. 18A, pp. 1813-1817.

Fuchs, G. et al., "Upper Critical Field and Irreversibility Line in Superconducting $MgB_2$", Solid State Communications 118 (2001) 497-501.

* cited by examiner

PROCESSING OF MAGNESIUM-BORIDE SUPERCONDUCTORS

RELATED APPLICATIONS

This application claims priority under 35 U.S.C. §119(e) to the following provisional applications: U.S. Ser. No. 60/274,402, filed Mar. 9, 2001, U.S. Ser. No. 60/274,752, filed Mar. 10, 2001, and U.S. Ser. No. 60/303,058, filed Jul. 5, 2001, all entitled "Processing of Magnesium-Boride Superconductors."

BACKGROUND OF THE INVENTION

The invention relates to magnesium boride superconductors. In particular, it relates to the processing of magnesium boride into superconducting wires.

Although magnesium boride ($MgB_2$), a hexagonal, layered compound, has been known for years, its superconducting properties have only been recently discovered by J. Akimitsu et al. (Symposium on Transition Metal Oxides, Sendai, Japan, Jan. 10, 2001). The recent discovery of superconductivy at about 39K has produced a high level of activity directed to characterizing $MgB_2$ in more detail and to synthesizing the superconductor in bulk form. $MgB_2$ behaves like a classic BSC superconductor with a relatively low irreversibility field. $MgB_2$ is an interesting superconducting material due to its strongly linked current flow, even though it has a relatively low $H_{c2}(0)$ and only a modest critical temperature, $T_c$. The irreversibility field parallel to the c-axis is between 2 and 4 T at 25 K, and therefore $MgB_2$ will be bested suited for applications at operating temperature and field ranges of less than about 30 K (e.g., 15 to 30K) and less than about 3 T (e.g., 0–3T), respectively. Both monofilament and multifilamentary wires are attractive additions to the available superconducting wires. Multifilament wire desirably is capable of being twisted and cabled.

Takano et al. prepared bulk samples by hot pressing, and found considerable differences with sintering temperatures between 775° C. and 1000° C. (Preprint). Transitions were much sharper in the sample pressed at 1000° C. than the one pressed at 775° C., and the normal state resistivity was much lower. The M-H curves at 10K through 35K also showed much higher critical currents for the 1000° C. sample. Critical current densities ($J_c$) derived from these M-H curves were typically an order of magnitude lower than those in the powder and were 400 A/mm$^2$ at 20K, 1T. The upper critical field was estimated to be over 25T.

$MgB_2$ is typically formed by heating magnesium and boron in a sealed tantalum-lined ampoule at high temperatures (995° C.) (Bud'ko et al., Preprint; and Bianconi et al., Preprint). Takano et al. prepared bulk samples by hot pressing, and found considerable differences with sintering temperatures between 775° C. and 1000° C. (Preprint, Mar. 9, 2001, xxx.lanl.gov/abs/cond-mat). Liquid magnesium is chemically aggressive and will react with almost any oxide due to the high stability of MgO. Lower reaction temperatures are desired to reduce reaction of the reactive components with their environment.

Among the more useful known low temperature superconductor (LTS) materials is $Nb_3Sn$, an intermetallic compound having the so-called A-15 crystal structure. Both intermetallic and ceramic high temperature superconductor (HTS) superconductors perform better when the superconductive material is divided among a number of filaments embedded in a metallic matrix. LTS and HTS materials have been prepared as multifilamentary conductors. Multifilamentary wires are particularly useful at low temperature or to reduce ac losses. At higher temperature, i.e., ≧20° K, a monofilament wire can sometimes be used.

A typical process for the manufacture of a multifilamentary $Nb_3Sn$ conductor begins with the drilling of a plurality of holes in a Cu/Sn bronze billet for the insertion of Nb rods. This billet is then extruded to a rod, drawn down to fine wire, and then heated to form the superconductor. A higher filament count is achieved by cutting the rod prior to drawing into a large number of equal lengths at some intermediate size, inserting these into an extrusion can, extruding this assembly and drawing the resultant billet into a wire, which is then heated to form the superconductor. The rod may be drawn through a hex-shaped die prior to cutting, which provides a space filling shape for subsequent assembly.

Mechanical alloying of constituent metals of a superconducting material also is known. Mechanical alloying has long been known and was originally developed for the manufacture of high strength structural alloys. Mechanical alloying has been used for the production of low temperature superconducting $Nb_3Sn$ and $Nb_3Al$ powders. See Larson et al., Manufacture of Superconducting Materials, *Proc. Intl. Conf.* November 1976, Ed. R. W. Meyerhoff, p. 155 (1976).

In the field of HTS, mechanical alloying has been used to make so-called metallic precursor filaments in a metallic matrix, which can be shaped in the metallic state and then transformed into the HTS ceramic oxide wire after completion of the extrusion and wire drawing. For example, suitable metal powders are milled into a fine metallic powder that is used to fill silver tubes that are then processed by extrusion or drawing into filaments. These are then bundled in a silver tube, and extruded again to make a multifilamentary wire, if desired. The HTS phase is formed by oxidizing the metallic precursor filaments. Transmission electron microscopy of the metallic precursor powders has shown that these are not layered but amorphous, with no discernable or very fine grained multiphase crystalline structure. The elements are often well mixed on an atomic scale. See, Otto et al., *IEEE Trans. Appl. Supercond.* 3(1):915 (1993); and Yurek et al. *Met. Trans.,* 18A:1813 (1987).

Little is known or understood about the superconducting properties and related processing capabilities for the newly identified superconductor $MgB_2$. Methods of forming magnesium boride precursor powders, of obtaining long lengths of magnesium boride superconductor wires or tapes and of forming magnesium boride films are desired.

SUMMARY OF THE INVENTION

The present invention provides novel processes for the manufacture of $MgB_2$ in useful forms such as wires or coatings.

In one aspect of the invention, a method of making a magnesium boride superconductor includes combining magnesium-containing and boron-containing precursors to form a homogeneous mixture of magnesium- and boron-containing powders. The combining step is carried out under an inert or reducing environment. In at least some embodiments, the combining step is selected from the group consisting of ball milling, rod milling, and high energy ball milling.

In at least some embodiment of the invention, $MgB_2$ precursor powders are prepared by mechanically alloying magnesium-containing and boron-containing starting powders. Alternatively, the starting powders may include finely dispersed boron particles and a reactive magnesium containing phase. The precursor materials are processed under controlled conditions to avoid the undesirable formation of secondary phases and impurities that may be deleterious to the superconducting properties of $MgB_2$. The fine particle size, homogeneity of the powder and intimate mixture of mechanically alloyed magnesium and boron precursors provide a highly reactive precursor that converts into the superconductor phase are lower temperatures and with greater reaction rates than conventional powders.

In at least some embodiments, the precursors include one or more of elemental magnesium and boron, or intermetallic compounds. In some embodiments, the precursors are selected from the group consisting of magnesium, boron, $MgB_4$ and $MgB_7$.

In at least some embodiments, the mechanically alloyed powders have an average particle size in the range of about 5 nm to about 1 μm, or the powders are alloyed at temperatures of less than −20° C.

In at least some embodiment, the magnesium-containing precursor is a magnesium alloy, or the magnesium alloy is selected from the group consisting of Mg—Cu and Mg—Li alloys.

In at least some embodiments, the precursor further includes additives selected to modify the mechanical alloying process or to dope the resultant precursor powders, or the alloying elements are selected from the group consisting of copper, sodium, lithium, calcium, silver, palladium and aluminum, or the precursors include metal hydrides.

In some embodiments, the process is conducted in the absence of reactive gases, such as oxygen, water vapor, nitrogen and carbon dioxide, so as to avoid oxidation or moisture uptake by the precursors or other detrimental reactions. In still other embodiments, the precursor powders are processed at temperatures below ambient and preferably at cryogenic temperatures. The precursor powders are used in the fabrication of monofilament and multifilament wires. Alternatively, the precursor powders are prereacted to form magnesium boride, which is then used in the wire fabrication process.

In at least some embodiments, the magnesium-containing and boron-containing precursors include dispersed boron particles and a reactive magnesium-containing phase.

In another aspect of the invention, a method of making a magnesium boride superconductor includes combining magnesium-containing and boron-containing precursors to form a homogeneous magnesium- and boron-containing powder, such that the combining step carried out under an inert or reducing environment, wherein at least one of the magnesium-containing and boron-containing precursors is a vapor in the combining step.

In at least some embodiments, a Mg- and B-containing powder material is prepared by reaction of fine particle size boron with the vapor phase of magnesium. In at least some embodiments, the reaction is conducted under conditions that permit the formation of boron condensate or nanoscale boron in the presence of magnesium vapors so that the reaction to form $MgB_2$ is very rapid or instantaneous.

In at least some embodiments, the boron-containing precursor is a powder.

In at least some embodiments of the inventions discussed herein, flux pinning sites are introduced into the precursor. The flux pinning particles are selected from the group consisting of metal borides, metal carbides, oxides of aluminum, zirconium, magnesium, yttrium, ytterbium, lanthanum, thorium, boron and calcium, carbon, copper and boron.

In at least some embodiments, the flux pinning particles are introduced during precursor fabrication, or after precursor fabrication.

In at least some embodiments of the inventions discussed herein, the homogenous mixture of the magnesium- and boron-containing precursor is introduced into a metal sheath, and in some embodiments the sheath is selected from the group consisting of copper, stainless steel, nickel alloys and oxide dispersion strengthened copper, or the sheath is selected from the group consisting of copper, tantalum-lined copper, niobium-lined copper, and iron-lined copper.

In at least some embodiments, the homogenous mixture of the magnesium- and boron-containing precursor is heated to convert the precursor into superconducting magnesium boride and/or to sinter the superconducting magnesium boride.

In one aspect of the invention, a method of forming a thin film magnesium boride superconductor includes contacting a vapor of magnesium-containing compound and vapor of a boron-containing compound with a heated surface, whereby a magnesium boride layer is deposited on the surface.

In at least some embodiments, the vapors are introduced into a reducing atmosphere. In at least some embodiments, the substrate is a fiber, or a foil, or the substrate is made up of a material selected from the group consisting of nickel alloy steel, copper, tungsten, tantalum, niobium, stainless steel and copper and nickel alloys.

In another aspect of the invention, an $MgB_2$ superconductor is prepared as a film or coating using chemical vapor deposition (CVD) of volatile precursors, such as magnesium and boron halides, or physical vapor deposition of one or more reactive precursors. A method of forming a thin film magnesium boride superconductor, includes depositing a boron layer onto a substrate; and contacting a vapor of a magnesium-containing compound with the boron layer, whereby a magnesium boride layer is deposited on the surface.

In at least some embodiments, the boron is reacted with the magnesium vapor at elevated temperatures, or the boron layer is deposited by physical vapor deposition, plasma sputtering, or plasma spray deposition.

In another aspect of the invention, a $MgB_2$ superconducting article includes a mechanically alloyed powder core including magnesium and boron. In at least some embodiments, the powder core is disposed in a metallic sheath. In at least some embodiments, the powder is a precursor to a magnesium boride superconductor, or the powder includes a magnesium boride.

In another aspect of the invention, a superconducting article includes of one or more elongated metal matrix regions containing one or more embedded elongated superconducting regions running the full length of the article, and is of proportions of approximately 53 weight % Mg and 47 weight % B with a density greater than 95% of the theoretical density, and a transition temperature in zero field of 30 K to 30 K.

In at least some embodiments, the superconducting article has a cross-sectional dimension in the range of 0.1 $mm^2$ to 5 $mm^2$.

In at least some embodiments, 40% to 80% of the cross-section is made up of a non superconducting metal matrix, or the metal matrix made up of copper or a copper alloy, or the metal matrix is made up of copper or a copper alloy, and a second thin metal layer between the Mg—B regions and the copper regions.

$MgB_2$ provides an interesting alternative material to HTS oxide superconductor for wire and cable manufacture. $MgB_2$ appears to be strongly linked with good prospects for being made as a round filament wire that can be twisted and cabled, so that the development of an ac wire functional at temperatures below and up to about 30K is feasible. The processes of the invention for fabricating $MgB_2$ superconductor into long lengths provide attractive routes to mono- and multi-filament wires. The process of the invention also provides access to a composite material having an interconnected magnesium boride network that provides an adequate fraction of connectivity throughout the composition to achieve practical critical current levels. The superconducting wire may be used, for example, in motor windings, generators, cables, MRI magnets and other magnet applications, and coatings may be used in wire or thin film applications.

As used herein, "about" refers to ±10% of the recited value.

Throughout the specification, "wire" and "tape" are used interchangeably, unless otherwise noted.

"Mechanical alloy" refers to constituent elements of a powder that are finely dispersed and that have a dimension on the nano- to submicron-scale.

BRIEF DESCRIPTION OF THE DRAWINGS

The invention is described with reference to the drawings, which are presented for the purpose of illustration only and are not limiting of the invention, and in which.

Figure 1:
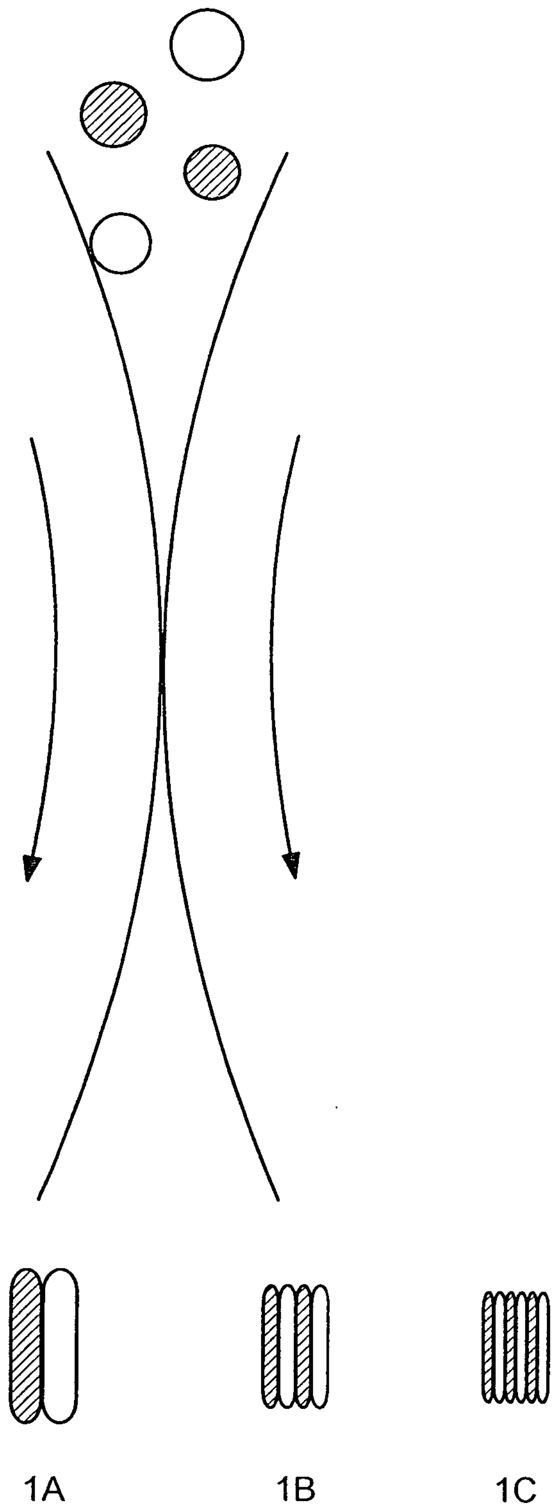
FIGS. 1 A–C is an illustration of a model for mechanical alloying of ductile metals.

DETAILED DESCRIPTION OF THE INVENTION $MgB_2$ has some unique processing requirements if it is to be successfully processed into superconducting wire. The magnesium component of the material is water and oxygen sensitive. For example, the presence of MgO, an oxidation product of Mg, is speculated to have a detrimental effect on superconducting properties. See, Larbalestier et al., Preprint. In addition, boron reacts readily with nitrogen in the atmosphere to form boron nitride. Boron also is much more brittle than any of the component elements of traditional intermetallic superconductors. The brittleness of boron as a starting material and the nitride reaction products also needs to be addressed if the material is to be successfully processed into wires and cables.

In at least some embodiments of the invention, a fine particle size, homogeneously dispersed Mg- and B-containing powder is provided for use in the manufacture of $MgB_2$ superconducting wires and tapes. It has been discovered that commercially available materials, such as $MgB_2$ available from Alfa-Aesar, is not optimal for high performance wire fabrication process contemplated herein. Analysis of these powders under high magnification shows that the powder is non-homogenous. Furthermore, analysis by scanning electron back scattering detection establishes that these materials are boron-rich or even contain unreacted boron. Thus, optimal materials for $MgB_2$ wire fabrication are not yet available.

In one aspect of the invention, the constituent elements of the $MgB_2$ superconductor, magnesium and boron, are mechanically alloyed under controlled conditions to provide an intimately mixed reactive power for the preparation of the superconducting product. Mechanical alloying includes the mixing and milling of source powders often without chemical reaction between constituents. Mechanical alloying is carried out under conditions that substantially avoid the formation of secondary phases and contaminants that are deleterious to the superconducting properties of the product. During milling, the source powders are co-deformed and become intimately mixed and bonded, often forming true alloys with relatively homogeneous distribution of the chemical constitutents even at the atomic scale. The method not only produces powders but mixes elements on a scale that is normally only possible with miscible liquids, or when using diffusion-based homogenization at very high temperatures. The method also allows the production of metastable powder mixtures. The reactive powder reacts at lower temperatures and in shorter reaction times to form the superconductor than conventional powders.

"Mechanical alloy" refers to constituent elements of a powder that are finely dispersed and that have a dimension on the nano- to submicron-scale. A mechanical alloy is a homogeneous dispersion, demonstrates high reactivity to form the product and a high tendency to densify and sinter upon heating. The ability to sinter provides connectivity with the powder and increases critical current and critical current density.

In at least some embodiments the elements are combined in amounts approximating their stoichiometry in $MgB_2$ that is about 53 wt % Mg and about 47 wt % B. Variation about the stoichiometric proportions is contemplated. The starting metal powders can be fine or coarse powders, but also may be metal flakes, chips, turnings, or chopped wire. The source can be elemental, e.g. Mg and B metal, or it can be an alloy, for example, Cu—Mg alloy, or a compound such as a boride, for example $MgB_4$ or $MgB_7$.

FIG. 1 shows a model for mechanical alloying of ductile metals that can be used in at least some embodiments of the invention. In the initial stage particles are bonded together as shown in FIG. 1A. With repeated feed-through the particles will look like those shown in FIG. 1B and later, as in FIG. 1C. With progressive milling the powder will break up and form a fine, multi-layered powder.

The actual deformation path during the process can differ substantially, depending on the powders that are used, whether these are ductile or brittle, or whether they work-harden rapidly, the starting size and so on. The powder mixture is passed through a rolling mill or milled in a ball or rod mill. This powder may be processed into wire using a powder-in-tube (PIT) or powder in wire (PIW) method.

Figure 2:
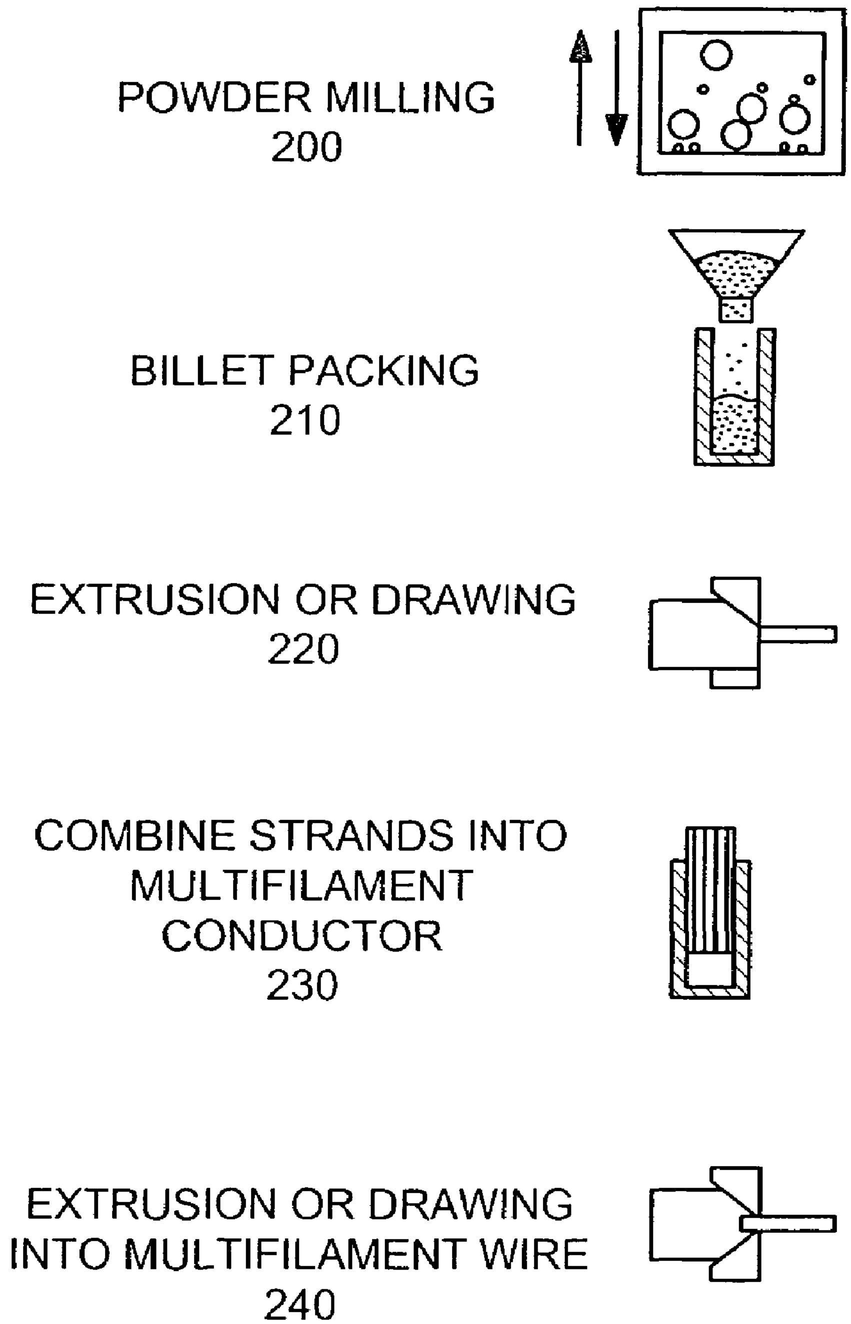
FIG. 2 is a flow diagram for the production of multifilamentary $MgB_2$ wire, in which the final wire is optionally heat treated to enhance the superconducting properties, such as critical current density.

A typical process for the production of $MgB_2$ wire, which permits the formation of long lengths of wire from an Mg—B powder according to at least one embodiment of the invention, is shown in FIG. 2. Precursor materials to the magnesium boride superconductor are prepared by mechanically alloying constituents elements and/or intermetallics, e.g., Mg+B, or Mg+$MgB_4$ or Mg+B+$MgB_4$ or Mg+$MgB_7$ or these combinations with added components, e.g., transition metal elements, as shown in step 200. For example, lithium, silver, palladium, copper or aluminum may be added to increase the hardness of the magnesium, which is otherwise very malleable and soft. In some embodiments, a magnesium alloy may be used in place of magnesium. Suitable magnesium alloys include, for example, Mg—Cu alloy, Mg—Li alloy or alloys with other elements that do not influence superconductivity, but which affect the alloying properties of magnesium.

In at least some embodiments, alloying is carried out at lower than ambient temperatures, and preferably it is carried out at temperatures significantly lower than ambient temperatures so as to prevent sticking, large alloy particles and deleterious chemical reactions. In one embodiment, mechanical alloying is accomplished at less than −20° C., and more preferably at less than −100° C. in order to obtain the desired fine particle product. The loading and processing of the constituent powders are done under inert gas conditions to prevent oxidation of the constituent powders, or reaction with nitrogen (to form BN) or reaction with water vapor (to form MgO or $Mg(OH)_2$) and uptake of contaminants such as carbon (from $CO_2$) and sulfur. Milling at lower than ambient temperatures also reduces reaction with trace amounts of oxygen, carbon, $H_2O$, sulfur, and nitrogen.

In at least some embodiments, magnesium- and boron-containing powders are milled in a ball mill, a high energy ball mill or rod mill. Mechanical alloying may be accomplished by Spex, ball or rod milling. With Spex milling (a high energy form of ball milling), the total milling time is typically less than 1 hour, while with ball or rod milling it is typically less than 6 hours. However the milling procedure may consist of periodic stoppage of the mill, followed by re-cooling to dissipate the heat of work and friction, or even discharging the mill, crushing the constituents (via for example a hammer mill) and re-loading the charge and continuing with milling. This cycle may be repeated for example up to 6 times. Milling may be accomplished with the charge in liquid slurry, or more preferably dry. The milling media can be steel, copper, carbide (for example, tungsten carbide) or ceramic (for example, zirconia) in the form of for example balls, rods or pellets.

In at least some embodiments, additional elements such as sodium, lithium, or calcium can be included in the precursor mixture in order to enhance milling and the superconductor properties. In at least some embodiments, these elements are added as metal hydrides to maintain reducing conditions in addition to any other advantageous effects the elements may have on milling and/or superconducting properties. Additional elements to dope the superconductor for enhanced properties can be similarly included. The methods disclosed herein are well-suited for the preparation of doped magnesium boride, and such variations are contemplated as within the scope of the invention. By way of example only, mechanical alloying of alkali metals and alkaline earth metals as dopants may be readily accomplished using the methods of the invention.

In some embodiments, the average particle size is in the range of about 5–100 nm, and in some embodiments is in the range of about 5–30 nm. The particle size range or distribution can be from about 0.005 μm to 100 μm (microns), and preferably in the range of 0.005 μm to 1 μm. The precursors may consist of the elements, Mg and B, in appropriate proportions to make the desired superconductor, e.g. in a ratio of about 53% Mg to 47% B by weight. Alloying conditions and alloying additives are selected to avoid the harder elemental boron from becoming embedded in a soft magnesium matrix. In addition, use of small particle size boron can result in work hardening as the particles tend to act as pinning centers for dislocations. The work-hardened composite is more readily broken up into fine power. The primary precursors may also consist of other mixtures to achieve the final $MgB_2$ composition, such as Mg+$MgB_4$ or Mg+B+$MgB_4$. In at least some embodiments of the invention, the Mg is prealloyed or reacted with Cu to form an intermetallic compound. This is then milled with the boron or $MgB_4$ to form a copper-containing precursor material.

Other methods of preparing fine powder Mg—B material are contemplated for use in the present invention. In at least some embodiments of the invention, superconducting $MgB_2$ powder is formed in a vapor phase reaction of the constituent elements. For example, the formation of $MgB_2$ includes the direct reaction of the elements, e.g., Mg vapor may be reacted with B at 800°–1000° C. to form $MgB_2$. This generally results in powder with a particle size reflecting the particle size of the starting B powder, e.g., larger than the preferred particle size. Milling power to fine size can enhance homogeneity and reduce particle size.

The precursor powder can include finely dispersed boron particles in a reactive secondary, e.g., magnesium-containing, mixture. In at least some embodiments, the boron particles are less than 10 microns (μm), or less than 5 microns (μm), or less than 2 microns (μm) or even 1 micron (μm), for obtaining uniform properties in reasonable processing times. The smaller particle size of the elemental boron promotes a more complete and uniform reaction of the boron with magnesium (or other cation). The fine boron particles are reacted in a solid state reaction with magnesium-containing particles. The boron particles are also reacted with a magnesium source as a solution or vapor. An additional feature of fine particle size starting materials is that the reaction temperatures may be lowered. By using a more reactive phase, i.e., fine particles and solution or vapor phase reactants, the reaction temperature may be as low as about 500° C., although higher temperatures are also contemplated as within the scope of the invention.

In at least some embodiments of the invention and in order to overcome the low vapor pressure of boron at accessible temperatures, boron is produced directly in the presence of magnesium vapors at temperatures where the reaction of magnesium and boron occurs rapidly, or even instantaneously. One approach to producing boron is the pyrolysis of $BI_3$ on a Ta surface at 800°–1000° C. The pyrolysis is carried out in the presence of Mg vapor, and the formation of $MgB_2$ occurs almost simultaneously with the formation of the boron, resulting in an ultra fine particle size for the $MgB_2$. The precise particle size should be readily controllable by the concentration of the $BI_3$ and Mg vapors in the reaction chamber and also the temperature of the reaction. Other volatile boron compounds such as the boranes (i.e., $B_2H_6$) could also be used with this approach. In another variation, the tantalum (Ta) surface may be a fine filament that is continuously pulled through the reaction zone. In this configuration, the $MgB_2$ in the reaction can be deposited as a film directly on the Ta filament. Other metals or metal alloys having similar characteristics could be used. In another approach, magnesium and boron halides or other soluble reagents may be taken up into solution and nebulized into fine droplets prior to heating.

The additives and other processing variations described herein for mechanically alloyed powders may also be used in the processing of fine particle size boron precursor powders and vapor phase reacted precursor powders.

According to at least some embodiments of the invention, a mono- or multifilament composite wire or tape is prepared by packing any of the herein-described precursor powders or prereacted powders into metal cans, as indicated in step 210 of FIG. 2. Prereaction can be carried out at elevated temperatures to form the superconducting form of magnesium diboride prior to billet packing, if desired. The cans are inert (non-reactive at processing conditions) to the $MgB_2$ superconductor and can consist of copper, or tantalum-lined copper, or niobium-lined copper, or iron-lined copper. Copper can be replaced by a ductile alloy, such as a copper alloy with a high resistivity that reduces ac losses in the superconducting wire, for example, a Cu—Al alloy or Cu—Al—Ni alloy. Higher resistance layers between the filaments may be introduced by use of a composite monofilament billet with Cu—Ni, or a similar alloy jacketing the outside of the billet. Magnetic scattering is favorable for inducing resistance in the regions between the superconducting filaments, for example by use of a high resistance layer including Mn, Fe, Co or Ni. In a monofilament, a strong sheath material can be selected, such as stainless steel, oxide dispersion strengthened copper, or nickel alloy, making use of the can liners previously described. Monofilaments are typically not used in ac applications so that the requirement of high resistivity is not found.

The cans are evacuated and sealed. Then, the cans are deformed into monofilament rods or wires, as indicated in step 220. The preferred deformation method may be drawing, extrusion or rod rolling at ambient or slightly elevated temperatures. For high-speed deformation, it is possible to chill the workpiece below ambient temperature in order to counteract the work-induced heating effects. This process is commonly referred to as a "powder-in-tube," or PIT process.

In those embodiments where a multifilament wire is desired, the space-filling monofilament rods produced in step 220 may be cut, cleaned, bundled and packed into another billet, tube or can (step 230), followed by deformation processing into fine multifilament wire (step 240). The rebundling and deformation steps may be repeated several times in order to attain the desired filament dimensions and filament count.

The resultant wire can be rolled to form a tape, and the wire or tape then is heated to form the superconducting phase and/or to sinter the superconducting powder core. Compressive stress can be introduced into the wire, which has been observed to improve critical current. A variety of techniques can be used to impart compressive stress, such as hydrostatic extrusion and wire drawing, hot forming and high reduction rolling. While not being bound by any specific mode of operation, it is believed that the observed improvements in critical current are due to increased powder density achieved by this process and/or to increase texture.

Alternatively, a composite wire is obtained using a technique known as "powder-in-wire," or PIW. In this method, the powder is continuously laid in a trough or furrow that has been introduced into a long length of metal. The trough may be lined with a inert or diffusion barrier material, such as niobium, tantalum or iron. The metal length itself is moved through the process in a reel-to-reel manner. After introduction of the powder into the trough, it is sealed to form a wire. The resulting monofilament may be processed to densify the powder, for example, by drawing, extruding or rolling. The wire may be heat treated or sintered to provide grain connectivity. This monofilament wire may be processed further as described below.

Typical filaments in a multifilament wire are in the range of about 1 to 20 micrometer in diameter. For ac applications, the wire would be twisted about its axis to tight pitches in the 0.2–20 cm range. The round precursor wire may be converted into the superconductor in its present form, or it may be shaped, i.e. rolled, into tape or other form prior to processing. Monofilament forms (wire or tape) of diameters in the 0.1 to 3 mm range and tapes of about 0.1–2 mm thick and 1–20 mm in width can be formed, with cross-sectional areas of 0.1 $mm^2$ to about 5 $mm^2$.

Although PIT and PIW methods have been described with specific reference to mechanically alloyed powders, it also is contemplated that these methods may be practiced using the fine particle powder precursors described herein.

The precursor material inside the composite filaments can be reacted by pulling the wire through the hot zone of a furnace and back out again in a continuous reel to reel approach. However, the reaction can also be activated and sustained by passing an electric current through the whole wire all at once, or through a select segment of the wire, with electrical contacts moving along the wire in a continuous process. The reaction furnace can be flooded with an inert or reducing gas (for example, hydrogen or nitrogen or argon or carbon-monoxide gas, or mixtures) or vacuum. In yet another approach the wire is heat-treated as a coil under pressure by hot isostatic pressing (HIPing). In yet another approach to densifying the precursor as it converts to the superconductor, the composite is hot deformed at the reaction temperature, with direct heating derived from the hot tooling. Reaction temperatures may be in the 500° C. to 1200° C. range, but preferably in the 500–1000° C. or 650–800° C. in order to minimize secondary reactions. With appropriate conditions, the heat generated by the exothermic diboride forming reaction is employed to accelerate the reaction and reduce processing time. Short reaction times make it possible to carry out the process in a continuous manner, with the wire precursor passing continuously through a furnace. The wire can be processed reel to reel or in batches. The batch process is carried out by forming and heating a coil of the wire to obtain the superconducting phase.

In at least some embodiments of the invention, flux pinning particles are introduced, e.g. by milling, into the precursor during precursor fabrication. These include diborides, e.g. $TiB_2$, that are more stable than the superconducting diboride. The particle size of these secondary particles is less than 0.1 micrometers, and can be, for example, MgO, boron oxide or excess boron.

Flux pinning centers can also be introduced by chemical means, involving formation of second phase precipitates within the superconducting material or at its grain boundaries. The precursor to the superconductor is then doped with an appropriate element such as carbon, a transition metal or an alkali metal, that is introduced either elementally, or as part of another material (carbon as a carbide, metals as borides or carbides). The dopant is dissolved into the superconductor or its precursors at high temperatures, but is subsequently precipitated to form secondary phases at lower temperatures (for example, in the 300° C. to 750° C. temperature range), different oxygen potentials (higher than the reducing conditions within the composite, for example, at $10^{-9}$ to 1 atmosphere oxygen equivalent activity) or different mechanical pressures those employed to form the superconductor.

The final microstructures with these artificial pinning centers (whether introduced directly during precursor fabrication or subsequently by forming it chemically after formation of the precursor) include dispersed particles, or more preferably, elongated rods or sheets of the secondary phase. The use of very fine carbon or ceramic fibers (oxides of aluminum, zirconium, yttrium, ytterbium, lanthanum, thorium or calcium, glass fibers, silicon, tungsten or boron carbide fibers, or fibers of various borides including non-superconducting magnesium boride fibers) is contemplated according to at least some embodiments of the invention. If flux pinning centers are formed in situ, elongated or fibrous secondary phases can be formed within grains or more preferably, at the triple junction boundaries of the fine superconducting grains where three or more grains intersect. This latter mechanism requires very fine grained superconductor, which may be formed reactively at low temperatures (500° C.–800° C.), or by milling together very fine grained $MgB_2$ (<1 micrometer in size) with some (5 to 30 weight percent) additional Mg and B (in one of the combinations described previously) to allow reactive sintering of the grains at low temperature. For this case, the fully reacted and sintered superconductor would be formed with local temperatures (at the reaction site) in the 500° C.–800° C. temperature range. If copper metal is added to or alloyed with the precursor as described above, then it also precipitates at low reaction temperatures from the precursor as very fine particles, rods or sheets as the $MgB_2$ forms, thereby providing the required flux pinning. Metals other than copper can also be used in this manner to form flux pinning centers.

In another aspect of the invention, $MgB_2$ films are provided.

In at least some embodiments, a boron layer is deposited on a non-reactive surface, such as for example tantalum, niobium, copper, iron nickel or aluminum, and the coated substrate is post-treated with magnesium vapor to form magnesium boride. Other metals or metal alloys having similar characteristics could be used as substrates. The substrate can be textured or a single crystal. A boron layer can be deposited using various known deposition methods, such a physical vapor deposition, plasma sputtering or other ablative technique, or plasma spray deposition. Other methods are immediately apparent to those of ordinary skill in the art and are contemplated within the scope of the invention. In at least some embodiments, a layer of boron of a desired thickness, e.g., 10 microns or less, is deposited, and the boron-containing substrate is then introduced into an environment, e.g., a reaction chamber, containing magnesium vapors. Magnesium has a relatively high vapor pressure and will vaporize at temperatures above its melting point. The magnesium vapor reacts with the boron layer, for example, at temperatures of about 950° C. The reaction may be carried out in a water-cooled quartz reaction chamber or a tantalum-lined reaction chamber. Sequential layers can be deposited and reacted to create structures having thicknesses of greater than 10 microns (μm).

In another aspect of the invention, an $MgB_2$ superconductor is formed using chemical vapor deposition (CVD).

In at least some embodiments, $MgB_2$-coated fibers or foils are prepared using magnesium and boron halides, which decompose and react on the designated surface. For example, $MgCl_2$ has a vapor pressure of 0.2–1.4 Torr between 800 and 1000° C., while $BCl_3$ has a vapor pressure of around 4 Torr at these temperatures. $MgI_2$ has a vapor pressure of 0.6–1.9 Torr at 800–1000° C., while $BI_3$ has a vapor pressure of around 5 Torr at 800°–1000° C. These halides can be used as reactants in the presence of hydrogen, where $H_2$ will reduce the halides to intermetallic $MgB_2$. The halides are reduced and reacted according to eq (1):

$$MgCl_2+2BCl_3+4H_2 \rightarrow MgB_2+8HCL \qquad \text{eq (1)}$$

The reduction takes place at the surface of the heated substrate, which can be an inert fiber such as Ta- or Nb-coated carbon or stainless or Ni alloy steel, fine Cu, W, Ta or Nb filaments. Alternatively, the substrate can be a heated foil such as Cu, Cu alloy such as Cu-4% Al, or a Nb, Ta, or stainless steel or Ni alloy foil.

Figure 3:
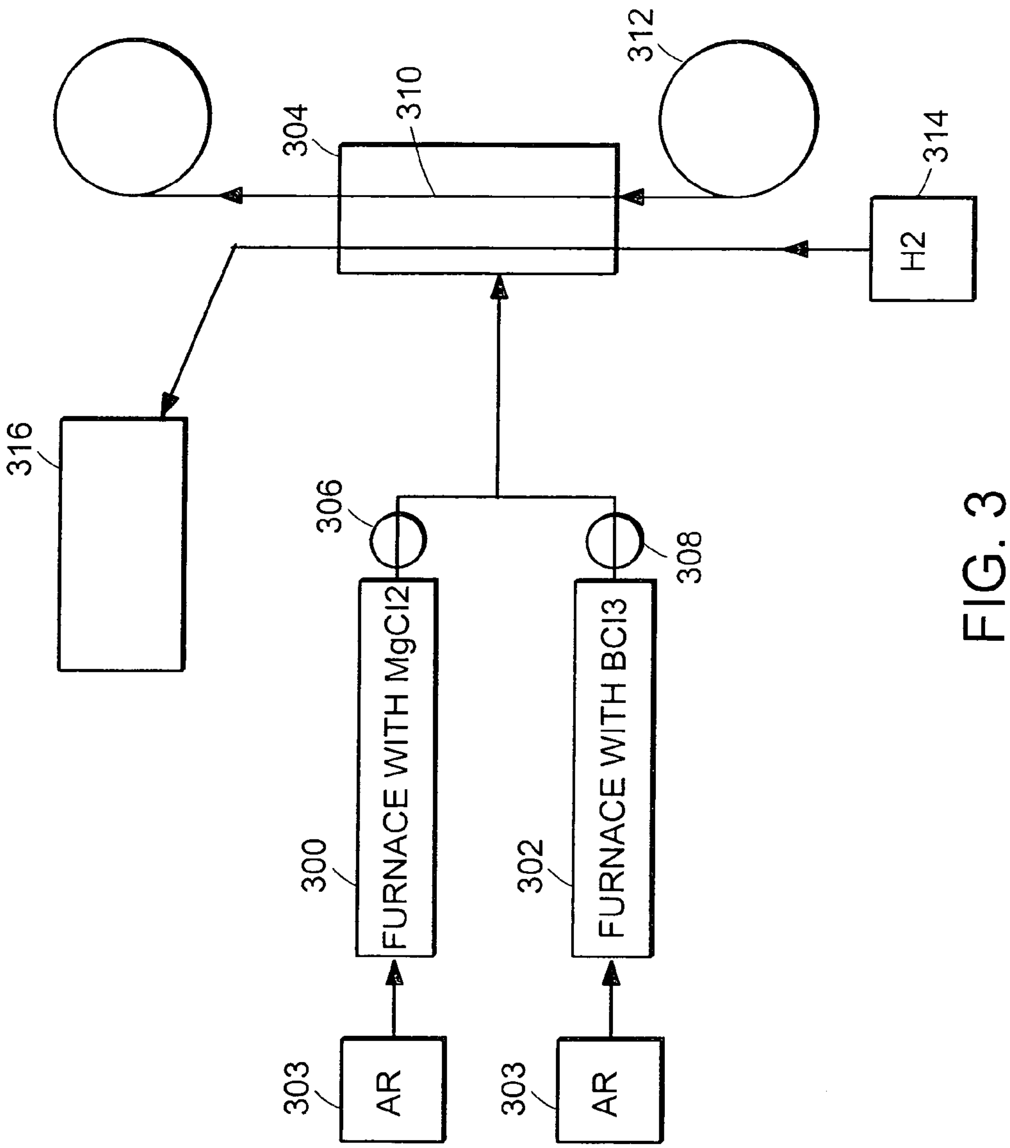
FIG. 3 is a schematic illustration of a CVD process used in the manufacture of $MgB_2$ fine powders.

A method of $MgB_2$ film formation is shown in FIG. 3. The halides are evaporated in individual furnaces 300, 302 and carried by a neutral gas 303 such as Ar into a reaction chamber 304. The gas flow controllers 306, 308 regulate the mass flow for each of the constituent halides. In a reaction chamber 309, a heated substrate 310 passes by using a reel-to-reel system 312, while a reducing gas 314 such as $H_2$ or Ar—$H_2$ gas mixture is passed over the heated substrate surface 310. The HCl generated as in eq. (1) is carried off in the hydrogen gas flow, and is passed through a neutralizing bath 316.

Figure 4:
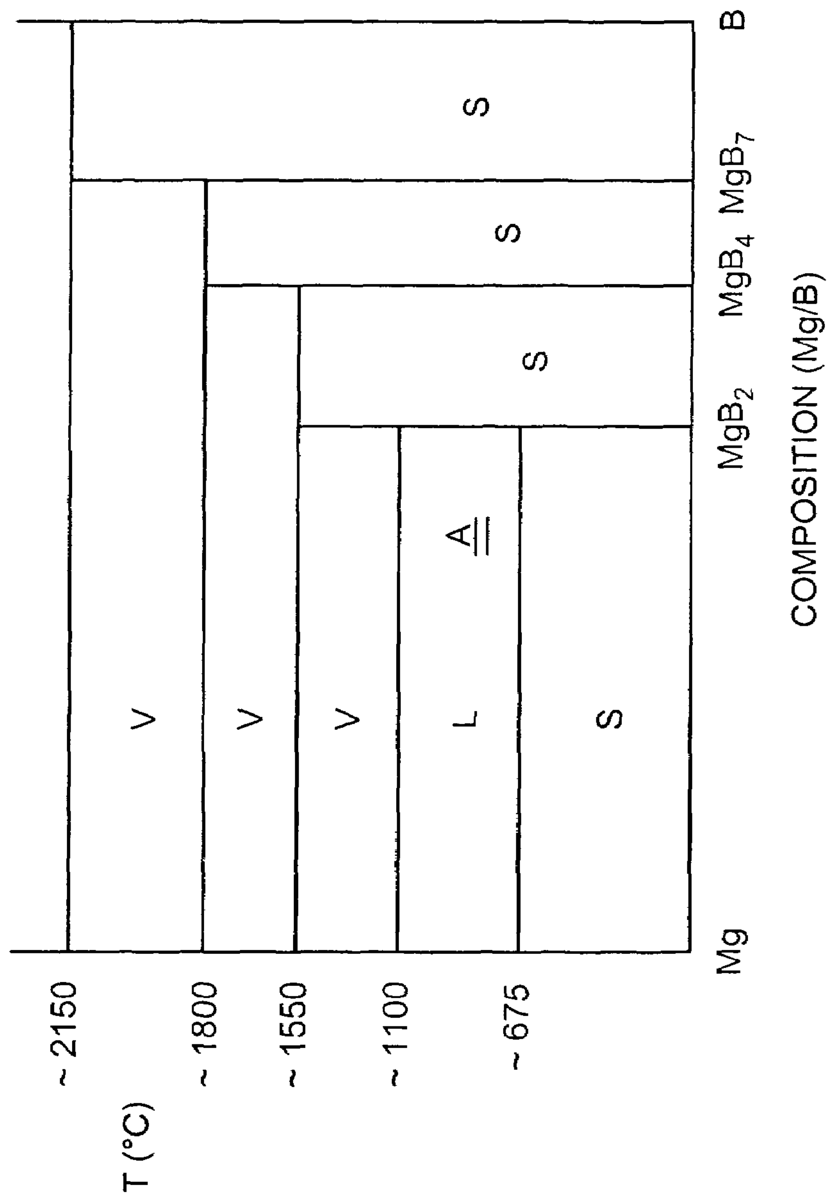
FIG. 4 is a temperature vs. Mg—B phase diagram indicating the presence of solid, liquid and vapor phases.

In yet another aspect of the invention, long lengths of superconductive material may be prepared as fibers. Fibers may be pulled directly from a melt of the appropriate composition. An Mg—B vs. temperature phase diagram is shown in FIG. 4. The composition of the melt is selected to obtain a congruent boron/magnesium melt. FIG. 4 indicates the existence of a magnesium-rich liquid phase, such as region A. A Mg—B containing fiber may be directly pulled from the melt having a composition within region A at temperatures of less than 1100° C. The melt can optionally include a flux to modify the melt properties of the melt.

In many of the above embodiments, the magnesium boride superconductor is in contact with non-superconducting surfaces, whether in a composite wire or a thin film, and other architectures. It is desirable that the surface in contact with the superconductor is chemically compatible, that is, that the surface does not react with or otherwise poison or contaminate the superconductor. To this end, materials used in processing of the magnesium boride superconductors should be substantially inert to the superconductor under processing conditions. Where not possible, a diffusion barrier may be employed. Multiple layers may be used as a diffusion barrier, including layers that are a mixture of borides, for example, a mixture of magnesium boride with other inert materials. Exemplary materials include tantalum or niobium. Other metals or metal alloys having similar characteristics could be used.

The invention is illustrated in the following example, which is not intended to be limiting of the invention.

EXAMPLE 1

This example describes the preparation of mono and multifilamentary $MgB_2$ wire from mechanically alloyed powders.

A mechanically alloyed Mg—B power was obtained by Spex milling. An Mg—B powder was prepared from Mg powder (average particle size of ~40 micron with pieces spanning a range from <1 micron to ~100 microns) and boron powder (particle size of one micron or less). The powder was milled under cryogenic conditions in a Spex mill (10 minutes×3 with 90 degree rotation between runs) under inert gas in the vials (Argon or Helium). Specifically, the charged mill vials were chilled by immersion in liquid nitrogen, followed by 10 minutes of spex milling with the spex mill in a liquid nitrogen-refrigerated enclosure. During this period the vial heated to a final temperature of about −20° C. from the heat of work and friction. After each 10 minute run, the vial was transferred to an inert atmosphere glove box and the contents examined for sticking and extent of mechanical alloying. The procedure was repeated three times—but in general may be repeated any number of times from one through about 10. In a refined approach after the first run series, the vials were merely re-immersed in liquid nitrogen after the 10 minute milling run, followed by further spex milling with the vial rotated 90 degrees to minimize alloy build-up on the vial walls. Experiments were also completed that showed the milling time could be varied from about 5 minutes to an hour without deleterious effects. Ball milling equivalent times were also calculated from this data and found to be in the 1 to 10 hour time range.

The powder mixture milled well and a good mechanically alloyed powder was made. After the final milling cycle, the product powder was removed from the Spex mill and evaluated for particle size and sticking. Samples were also composition analyzed by ICP. The particle sizes attained ranged from <1 micron to about 100 microns maximum. ICP showed the composition to nominally correspond to the charge composition: about 53 wt % Mg and 47 wt % B. The powder was stored in an inert atmosphere glove box to minimize exposure to air. X-ray diffraction showed no evidence of MgB2 formation.

Portions of the resultant Mg—B alloyed powder were incorporated into precursor wires as follows. Cylindrical copper billets were made with OFHC (low oxygen) rod that had been machined to form a deep cavity in each billet. After thorough cleaning and annealing of the billets in an inert atmosphere (2 hours at 600 C in nitrogen), they were packed with the alloyed precursor powder in one gram increments with an intermediate pressing operation. The billets were nominally ⅝" OD×5" long with the cavity being 7/16" ID and 3.5" deep. However the actual billet dimensions and billet materials may be varied greatly, and may even include multi cavity forms for directly making multi-filament wires.

After packing, a tail-cap with evacuation stem was welded onto each billet with the billet in a chill mould to prevent reactions from initiating. After evacuation for ½ hour at 100 C, the evacuation stem was crimped and sealed. The billets were then extruded at nominally 250° C. to different sizes. One shape was hexagonal with a flat-to-flat dimension of 0.146". The extrusion pressure was a low 50,000 pounds per square inch, indicating that extrusion to reductions of up to 300:1 are possible with common presses. Another shape was a 0.25" diameter rod. Samples of the hexagonal rod were cut up and subjected to structure characterization, reaction and property characterization tests. High quality superconducting MgB2 was found to form at temperatures in the 550° C. to 800° C. range in practical time spans (less than ~50 hours).

Samples of the above hexagonal wire were also rolled in multiple passes to a final nominal cross-sectional shape of 0.029" by 0.3", although further rolling is readily accomplished to produce much thinner dimensions.

Another billet was drawn at ambient temperature via 10% per pass reductions to a final hexagonal shape with a flat-to-flat dimension of 0.07", although other sizes are also clearly practical. This was accomplished without any anneals, but test showed that anneals of up to 20 minutes at temperatures to 250° C. were sufficient to soften the copper and allow indefinite amounts of ambient temperature drawing without adverse reactions. These drawn and shaped lengths are readily cut into rods, and re-bundled into another billet, followed by sealing and further deformation to form small cross-section round or tape shaped wires (typically 0.1 $mm^2$to about 5 mm in cross-section). The round wire is also readily twisted about its axis to form low ac loss architectures, particularly in the twist pitch regime of 3 mm to about 20 cm. A sample of this wire was also rolled in multiple passes to produce high aspect ratio precursor tapes, and fully consolidate the precursor material.

Tests were also completed to establish the feasibility of Ta foil lining a copper billet (foil thickness: about 25 microns), followed by powder packing and subsequent processing as described above.

In an alternative alloying process, copper and magnesium are pre-alloyed or prereacted to form Cu—Mg intermetallics, followed by milling together the boron and the Cu—Mg intermetallic. These are then put into the copper billets as before, and worked either by extrusion or drawing.

The fraction by volume, or cross-sectional area, of metal matrix in the wires described was in the 40% to 80% range, with the balance being the MgB2 superconducting material at a density of >95% of the theoretical.

EXAMPLE 2

This example describes the preparation of a multilayered $MgB_2$ coated wire. A Nb plated stainless steel wire is used as the coating substrate. A multilayer MgB wire is obtained by depositing multiple layers of boron, followed by reaction with a magnesium vapor. A barrier layer of copper is used between each layer.

A sequence of 10 iterations of boron deposition (at 5 microns thick) using physical vapor deposition (PVD), followed by exposure to Mg vapor at 900° C. is carried out. After each iteration, a non-superconductive layer of copper (Cu) is deposited using PVD.

Those skilled in the art will recognize or be able to ascertain using no more than routine experimentation, many equivalents to the specific embodiments of the invention described specifically herein. For example, while reference has been made above primarily to $MgB_2$, all these references should be understood to refer to the class of magnesium boride material doped with additional species such as copper, zinc, alkali metals, beryllium and so forth to further enhance the properties.

EXAMPLE 3

Figure 5:
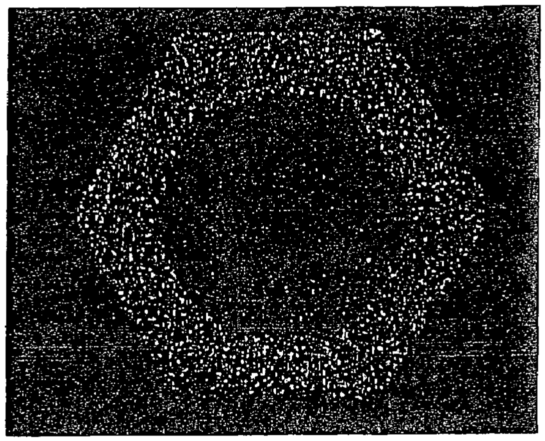
FIG. 5 is a photograph of a cross section of wire made up of an Mg- and B-containing precursor powder in a copper sheath, prepared according to at least one embodiment of the invention.

Sample wire made by the method ox example 1 with the cross-section shown in FIG. 5 was cut into lengths of 20 to 30 mm. Some had the copper cladding removed mechanically in a lathe, so that the reaction could be studied independently of the copper sheath.

The precursor wire was reacted to form superconducting $MgB_2$ at 600° or 700° C. in an atmosphere of 5% hydrogen and 95% argon for 1–2 hours. Reaction at higher temperatures (900° C.) resulted in mass loss (28%) and produced an x-ray diffraction pattern consistent with formation of $MgB_4$. Reaction at lower temperatures resulted in partial conversion to $MgB_2$ with some Mg still remaining. Measurement of the superconducting critical temperature confirmed the formation of the $MgB_2$ superconducting phase, however the critical temperatures of the samples (33.5–36.5K) were lower than that reported for pressed pellets reacted at 900° C. (38.5K).

Figure 6:
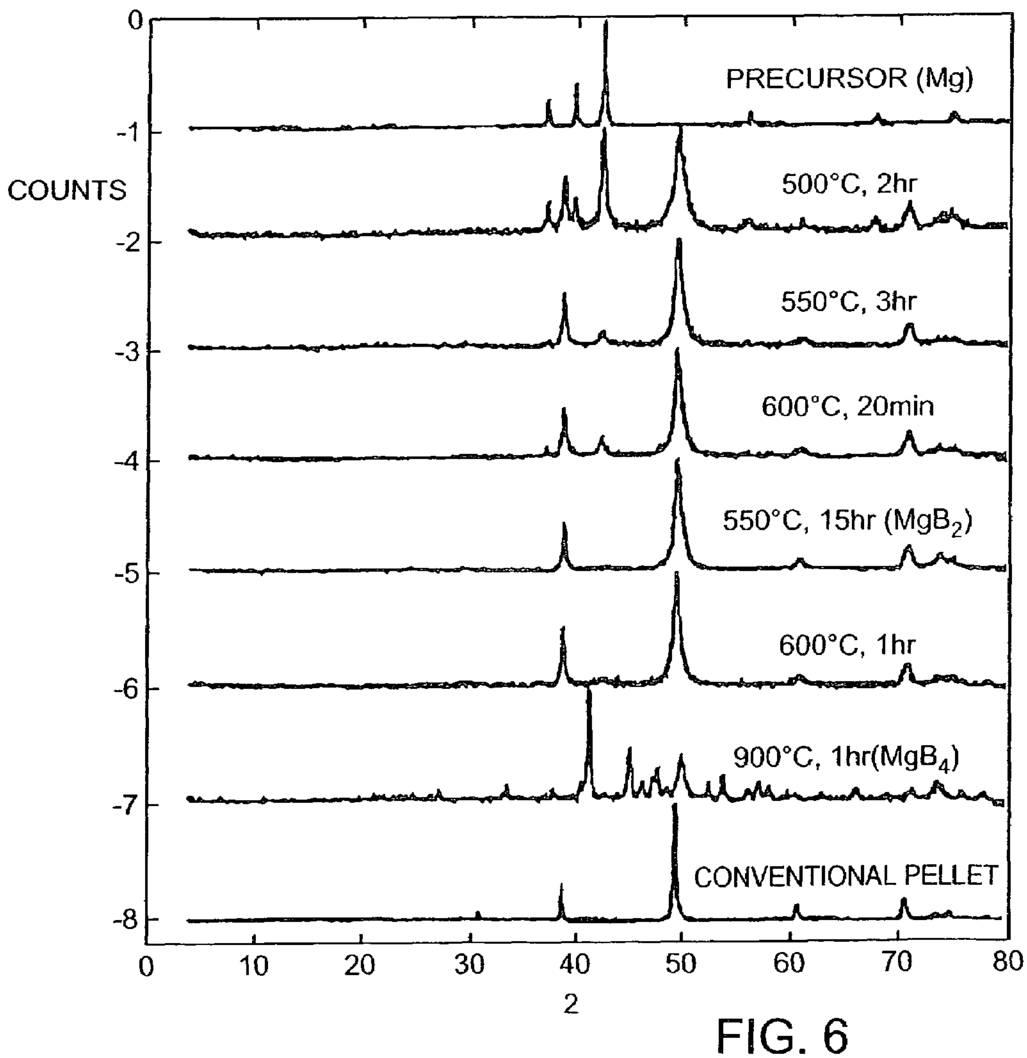
FIG. 6 shows 12 x-ray diffraction traces for the cores of magnesium-boron material reacted at different temperatures and durations in an atmosphere of 5% $H_2$ and 95% argon; the upper trace shows the pattern for the precursor magnesium-boron material and the bottom trace shows the pattern for a conventional ceramic pellet sample reacted at 900° C.

The short-length samples were reacted in an atmosphere of 5% $H_2$ and 95% argon for periods of time ranging from 20 minutes to 3 hours. It was generally found that when the alloyed materials were reacted under similar conditions to conventional pellets, namely around 900° C., the magnesium-boron material did not react to the desired $MgB_2$ phase but to $MgB_4$. Lower temperatures, however, resulted in successful synthesis of $MgB_2$. FIG. 6 summarizes the results of this example in the form of x-ray diffraction patterns obtained from exposed cores of the wires after reaction. The conditions of temperature and time of reaction are listed for each diffraction trace. The diffraction pattern at the top is for the precursor magnesium-boron alloyed material while the diffraction pattern for a conventional single phase $MgB_2$ pellet is shown at the bottom. Reaction at 500° C. for 2 hours (trace 2) produced partial conversion to $MgB_2$. Reaction at 550° C. for 3 hours or at 600° C. for 20 minutes (traces 3 and 4) resulted in a greater conversion to $MgB_2$. Reaction at 550° C. for 15 hours or 600° C. for 1 hour (traces 5 and 6) resulted in almost complete conversion, with negligible mass loss. Reaction at 900° C. for one hour resulted in complete conversion to $MgB_4$ and a mass loss of 26%. Reaction at 600° C. for one hour, then ramping to 900° C. and holding for one hour has negligible mass loss and formed pure $MgB_2$.

Figure 7:
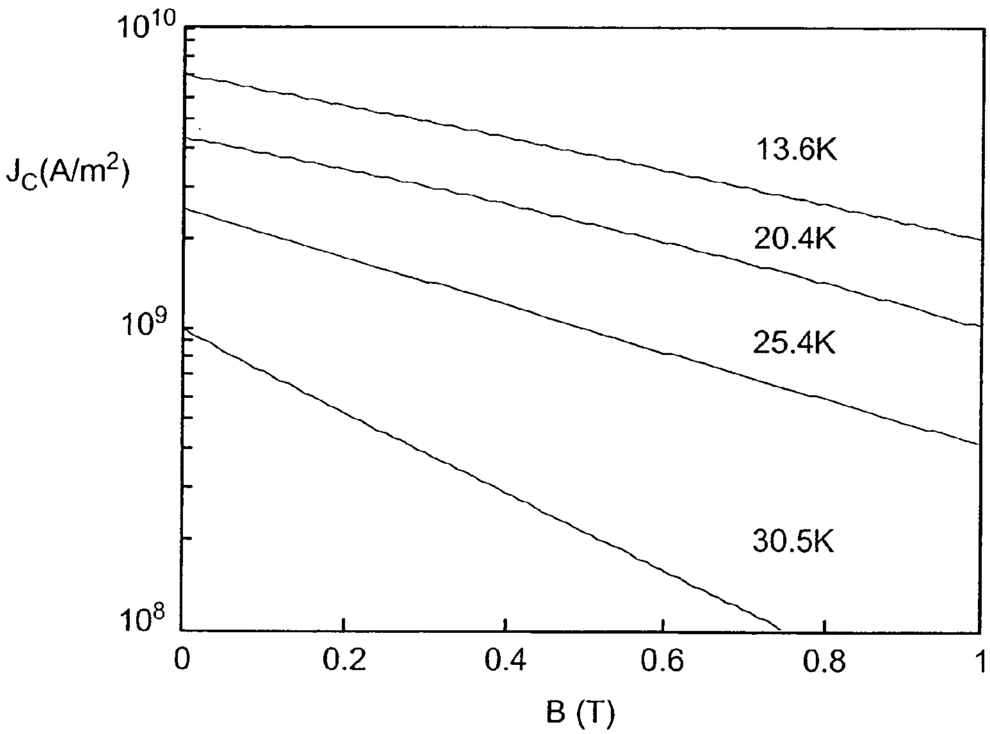
FIG. 7 shows a plot of critical current density, $J_c$, as a function of applied magnetic field for an alloyed sample reacted for two hours at 600° C.

A further short-length sample was reacted at 600° C. in an atmosphere of 5% $H_2$ and 95% argon for a period of 2 hours. The sample was then investigated in a vibrating-sample magnetometer to determine the magnetization as a function of temperature and magnetic field strength. Using the Bean critical state model and an established numerical fitting procedure the critical current density was determined from this magnetic data. FIG. 7 shows the critical current density, $J_c$, plotted as a function of applied field for various temperatures. The results indicate a $J_c$ value of $7\times10^5$ A/cm$^2$ at 14 K and zero applied magnetic field and $1\times10^5$ A/cm$^2$ at 20 K and 1 Tesla field. These are significantly better results than those obtained for pressed, sintered pellets.

Those skilled in the art will recognize or be able to ascertain using no more than routine experimentation, many equivalents to the specific embodiments of the invention described specifically herein. For example, while reference has been made above primarily to $MgB_2$, all these references should be understood to refer to the class of magnesium boride material doped with additional species such as copper, zinc, alkali metals, beryllium and so forth to further enhance the properties.

Although various embodiments which incorporate the teachings of the present invention have been shown and described in detail herein, those skilled in the art can readily devise many other varied embodiments that incorporate these teachings.

References cited herein are incorporated in their entirety by reference.

What is claimed is:

1. A method of making a magnesium boride superconductor, comprising:

combining magnesium-containing and boron-containing precursors to form a homogeneous mixture of magnesium- and boron-containing powders, said combining step carried out under an inert or reducing environment introducing the homogeneous mixture of the magnesium- and boron-containing precursor into a metal sheath; and heating the homogenous mixture to convert the magnesium- and boron-containing powders into a superconducting magnesium boride.

2. The method of claim 1, wherein the combining step is selected from the group consisting of ball milling, rod milling, and high energy ball milling.

3. The method of claim 2, wherein the precursors comprise intermetallic compounds.

4. The method of claim 2, wherein the precursors are selected from the group consisting of magnesium, boron, $MgB_4$ and $MgB_7$.

5. The method of claim 2, wherein the combining step comprises mechanically alloying the powders.

6. The method of claim 5, wherein the mechanically alloyed powders have an average particle size in the range of about 5 nm to about 1 μm.

7. The method of claim 5, wherein the powders are alloyed at temperatures of less than −20° C.

8. The method of claim 5, wherein the precursor further comprises additives selected to modify the mechanical alloying process or to dope the resultant precursor powders.

9. The method of claim 2, wherein the magnesium-containing precursor is a magnesium alloy.

10. The method of claim 9, wherein the magnesium alloy is selected from the group consisting of Mg—Cu and Mg—Li alloys.

11. The method of claim 9, wherein the alloying elements are selected from the group consisting of copper, sodium, lithium, calcium, silver, palladium and aluminum.

12. The method of claim 2 or 9, wherein the precursors comprise metal hydrides.

13. The method of claim 1, wherein the magnesium-containing and boron-containing precursors comprise dispersed boron particles and a reactive magnesium-containing phase.

14. The method of claim 1, wherein the precursors comprise one or more of elemental magnesium and boron.

15. A method of making a precursor to a magnesium boride superconductor, comprising:

combining magnesium-containing and boron-containing precursors to form a homogeneous magnesium- and boron-containing powder, said combining step carried out under an inert or reducing environment, wherein at least one of the magnesium-containing and boron-containing precursors is a vapor in the combining step.

16. The method of claim 15, wherein the boron-containing precursor is a powder.

17. The method of claim 2, 14 or 15, further comprising introducing flux pinning sites into the precursor.

18. The method of claim 17, wherein the flux pinning particles are selected from the group consisting of metal borides, metal carbides, oxides of aluminum, zirconium, magnesium, yttrium, ytterbium, lanthanum, thorium, boron and calcium, carbon, copper and boron.

19. The method of claim 17, wherein the flux pinning particles are introduced during precursor fabrication.

20. The method of claim 17, wherein the flux pinning particles are introduced after precursor fabrication.

21. The method of claim 2, or 15, further comprising:

introducing the homogenous mixture of the magnesium- and boron-containing precursor into a metal sheath.

22. The method of claim 15, further comprising:

heating the homogenous mixture of the magnesium- and boron-containing precursor to convert the precursor into a superconducting magnesium boride.

23. The method of claim 21, wherein the sheath is selected from the group consisting of copper, stainless steel, nickel alloys and oxide dispersion strengthened copper.

24. The method of claim 21, wherein the sheath is selected from the group consisting of copper, tantalum-lined copper, niobium-lined copper, and iron-lined copper.

25. The method of claim 21 further comprising:

heating the homogenous mixture of the magnesium- and boron-containing precursor to convert the precursor into a superconducting magnesium boride.

* * * * *